United States Patent [19]

Smith

[11] Patent Number: 5,354,159

[45] Date of Patent: Oct. 11, 1994

[54] CABLE DRIVE FOR DRILLING MACHINE Z-AXIS

[75] Inventor: William V. Smith, Tustin, Calif.

[73] Assignee: Excellon Automation, Torrance, Calif.

[21] Appl. No.: 164,463

[22] Filed: Dec. 9, 1993

[51] Int. Cl.$^5$ ............................................. B23B 47/18
[52] U.S. Cl. ...................................... 409/235; 408/10; 408/129; 74/89.22
[58] Field of Search .......................... 408/10, 129, 234; 409/185, 235, 237; 74/89.22

[56] References Cited

U.S. PATENT DOCUMENTS

| | | |
|---|---|---|
| 2,332,653 | 6/1943 | Mitchell . |
| 2,644,371 | 7/1953 | Baker ............................. 408/129 |
| 2,998,753 | 9/1961 | Knaub et al. . |
| 3,200,656 | 8/1965 | Baskett . |
| 3,394,384 | 7/1968 | Hines . |
| 3,529,481 | 9/1970 | Budzyn . |
| 3,611,819 | 10/1971 | Muller et al. . |
| 3,671,133 | 6/1972 | Galbasini et al. ............... 409/237 |
| 4,180,945 | 1/1980 | Zimmerman ..................... 408/234 |
| 4,315,437 | 2/1982 | Etcheparre et al. . |
| 4,327,596 | 5/1982 | Simon . |
| 4,401,406 | 8/1983 | Rovira . |
| 4,524,520 | 6/1985 | Levy . |
| 4,757,723 | 7/1988 | Carson . |
| 4,992,173 | 5/1990 | Lawler . |

Primary Examiner—Daniel W. Howell
Attorney, Agent, or Firm—Knobbe, Martens, Olson & Bear

[57] ABSTRACT

A cable passes over pulleys to precisely control the linear movement of a machine element back and forth along a guideway. The cable path connects multiple pulleys on stationary machine elements to multiple pulleys on the movable machine element, affording mechanical advantage to one driven pulley. A particular arrangement and alignment of the pulleys that pull in one direction with the pulleys that pull in the opposite direction cancel extraneous forces and moments and cause the resultant force to act on the center of gravity of the moving element.

20 Claims, 3 Drawing Sheets

CABLE DRIVE FOR DRILLING MACHINE Z-AXIS

FIELD OF THE INVENTION

The invention relates generally to the field of precise guidance systems and more particularly to a system for controlling the movement and position of a cutting tool along a linear path in a machine designed to drill holes in printed circuit boards.

BACKGROUND OF THE INVENTION

Printed circuit boards have a large number of holes which must be drilled at precise locations to enable mounting of electrical components and to make connections between circuits on different layers. Computer-controlled drilling machines have been developed to permit mass production of circuit boards at high rates. Typically, these drilling machines have a worktable mounted on a base and movable along both axes of a horizontal plane. The printed circuit boards, or workpieces, are mounted in stacks on the worktable. Movement of the worktable in the horizontal plane positions the circuit boards beneath a drill spindle at the precise location where holes are desired. Hole drilling occurs when the spindle moves downward.

Since the diameter of the holes drilled in the circuit boards can be extremely small, on the order of the size of human hairs, and the drilling tools are delicate, it is imperative that movement of the spindle be rapid, precisely controlled and that extraneous forces and moments do not deflect the rotational axis of the spindle from the intended location and direction of the hole. In prior systems, the vertical position of the spindle is controlled by a motor-driven leadscrew.

Several drawbacks are prevalent in these prior systems such as that illustrated in FIG. 1.

The moment of inertia of the leadscrew 1, attached directly to the motor shaft 2, impedes the ability of the motor 3 to accelerate the movable element 11.

Unless the center of gravity 5 of the spindle lies on the leadscrew axis 6, inertial reactions to leadscrew 1 forces produce moments that tend to deflect the spindle rotational axis 7 from the intended location of the hole.

Placing a measurement device for control-system feedback, such as a linear scale, in line with the spindle center of gravity 5 minimizes position errors arising from minute angular deflections of the spindle 4. Because both leadscrew 1 and linear scale cannot occupy the same space, use of a leadscrew 1 forces a design compromise that increases position errors.

The motor 3 is attached to the leadscrew by means of a flexible coupling 8 to prevent minor misalignment of the motor 3 and leadscrew 1 from overloading the motor 3 or leadscrew 1 bearings. This coupling 8 is costly, is subject to fatigue and breakage, and adds to the moment of inertia of the motor load.

A pair 9 of ball thrust bearings that are heavily preloaded against each other restrains axial motion of the leadscrew 1. These bearings 9 are costly, add to the motor's frictional load, and become loose near the end of their wear life, allowing uncertainties in the spindle 4 axial position.

The nut housing 10 that moves vertically up and down the leadscrew 1 is attached to the spindle housing 11 by means of thin struts 12 that flex to accommodate minor misalignments of the leadscrew 1 and the spindle's guideway 13. These struts 12 and their means of mounting add to the complexity and cost of the assembly.

Because the amount of misalignment tolerated by the flexible coupling 8 and struts 12 is very small, and because the mountings for the motor 3, the thrust bearings 9 and flexible struts 12 must be carefully aligned to the guideway 13, they permit only very small machining tolerances.

The leadscrew 1 must be ground to very small tolerances to avoid position errors arising from axial play and friction. Looseness of the nut 14 on the leadscrew 1 near the end of its wear life gives rise to uncertainty of spindle axial position during drilling.

The tendency of the nut 14 and its housing 10 to rotate must be resisted by a roller 25 that runs in a slot 26. This roller is costly and subject to wear.

Thus, a need exists for a linear motion-control system in which the inertia load on the motor is less, in which the cost and inertia of flexible couplings can be avoided, in which the cost and wear of guide rollers can be avoided, in which the machining tolerances are less critical, in which a measuring device can be mounted on the spindle rotational axis, and in which position uncertainty does not occur near the end of wear life.

SUMMARY OF THE INVENTION

The present invention comprises an apparatus for machining workpieces, which includes a work unit for securely mounting a cutting tool, a frame for supporting the work unit and permitting movement along a vertical axis, and a drive mechanism for vertically reciprocating the work unit relative to the frame along the vertical axis. The drive mechanism preferably comprises a cable/pulley system with at least four pulleys attached to the work unit and arranged symmetrically about the vertical axis, and at least four pulleys attached to the frame also arranged symmetrically about the vertical axis. At least two of the frame pulleys are attached above the work unit, while at least two are attached below the work unit. A flexible cable frictionally engages the pulleys, the cable having first and second ends connected to the frame. A motor is mounted to the frame for selectively moving the cable in either of two directions. The pulleys are arranged, and the cable has such a path that when the cable is moved in a first direction, the work unit is raised up, and when the cable is moved in a second direction, the work unit is moved down. The machining apparatus of the present invention is preferably positioned over a worktable capable of moving in at least one horizontal direction and having a work station adapted to secure a workpiece thereon.

In accordance with another aspect of the present invention, the cable path of the drive mechanism includes a plurality of intermediate portions extending directly between one of the work unit pulleys and one of the frame pulleys mounted above the work unit. Advantageously, there is a corresponding collinear portion of the cable path extending directly between one of the work unit pulleys and one of the frame pulleys mounted below the work unit for each intermediate portion between a work unit pulley and a frame pulley mounted above the work unit. Furthermore, each of the plurality of intermediate portions extending directly between one of the work unit pulleys and one of the frame pulleys above the work unit, as well as the corresponding collinear portion between a work unit pulley and a frame pulley below the work unit, pull cable over the same number of pulleys.

DESCRIPTION OF THE PREFERRED EMBODIMENTS

Figure 1:
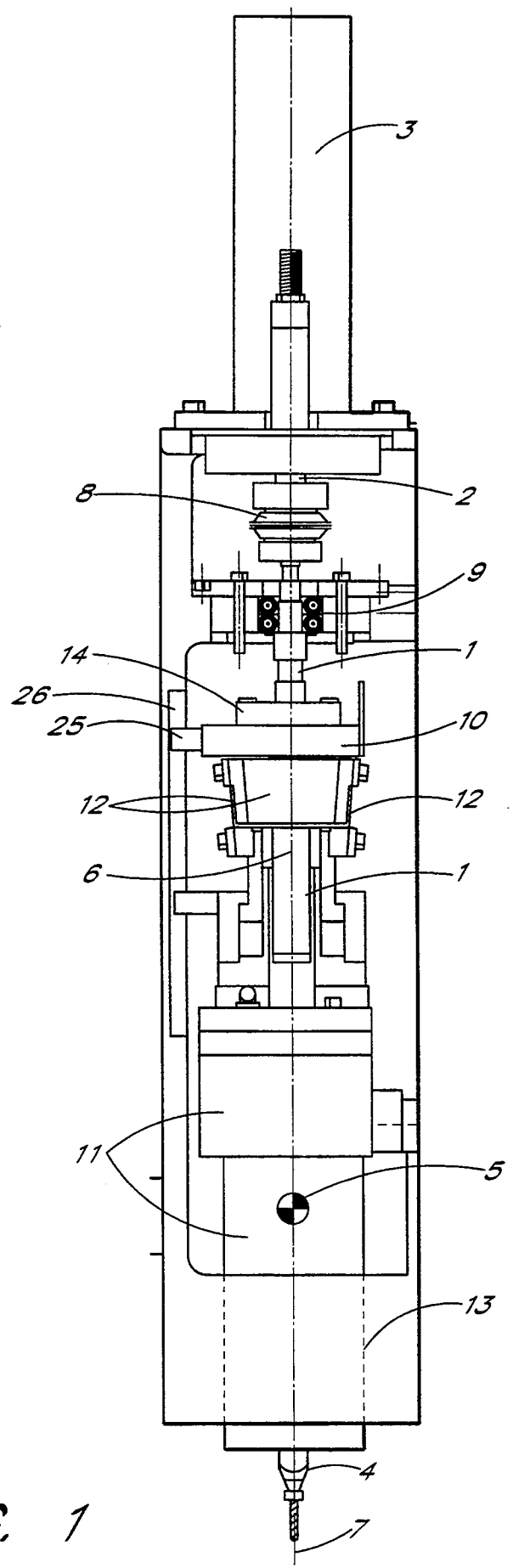
FIG. 1 is a front elevational view of a precision drilling tool of the prior art.
Figure 2:
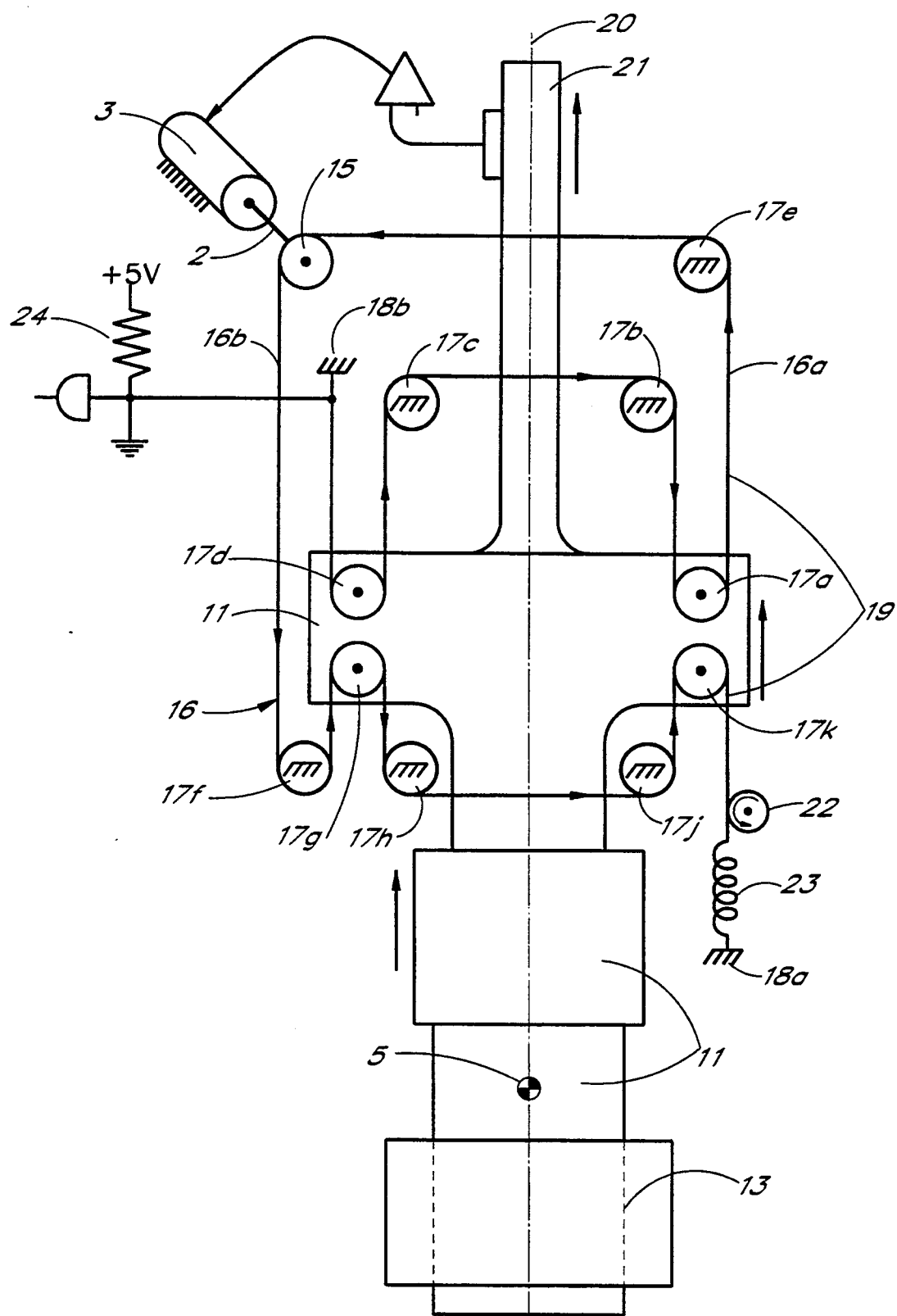
FIG. 2 is a schematic representation of the cable drive of the present invention adapted to actuate a precision drilling tool.

The present invention, shown schematically in FIG. 2, comprises an apparatus for controlling the position of a movable machine element 11 along a linear guideway 13. To achieve motion, a motor 3 turns a drive pulley 15 that pulls a cable 16. For simplicity and ease of understanding, the system shown in FIG. 2 has a mechanical advantage of 4:1. Higher mechanical advantages are possible using more pulleys.

From one side of the drive pulley 15, the cable 16a runs over a number of idler pulleys 17e, 17a, 17b, 17c, 17d alternately located on the movable element and on a stationary machine element to a place of attachment 18b. The number of idler pulleys depends on the desired mechanical advantage of the system. When the motor 3 turns to pull the cable 16a, the movable element 11 is pulled along its guideway 13.

The cable 16b from the other side of the drive pulley 15 goes to idler pulleys 17f, 17g, 17h, 17j, 17k, similarly arranged but on the opposite side of the moving element 11. When the motor 3 turns in the opposite direction, the cable 6b pulls the moving element from the other side, causing it to move along the guideway 13 in the opposite direction. As the amount of cable 16a on one side of the moving element 11 becomes less, the amount of cable 16b on the other side becomes more at the same rate. Thus, the total amount of cable 16a+16b in the system remains constant.

An important aspect of the invention is the manner of arrangement of the pulleys and cable path. Specifically, each part of the cable path that changes in length is parallel to the direction of motion and is matched by a similar part on the opposite side of the moving element, forming an opposed pair 19. Additionally, there are an even number of opposed pairs arranged axi-symmetrically about a line 20 parallel to the direction of motion, defined by the linear guideway 13, and passing through the center of gravity 5 of the moving element 11. In this way, the resultant of all the individual cable forces acts on the center of gravity 5 of the moving element 11 (as discussed in detail below), while the center of gravity 5 of the moving element need not be in line with any physical part of the cable path. This arrangement leaves space in line 20, with the center of gravity 5 available for use by a feedback measurement device such as a linear scale 21.

The tension in the cable 16 arising from pre-tension applied at a point of attachment 18a is the same throughout the cable. On each side of an opposed pair 19, the pre-tension is equal and acts in opposite directions on the movable element. The pre-tension in the cable exerts no net force or moment on the movable element 11.

When the drive pulley 15 tugs on the cable 16, tension increases on one side of the drive pulley 15 and decreases on the other side. In each of these two parts of the cable 16a and 16b, respectively, the resulting tension is uniform from the drive pulley 15 to the respective point of attachment 18a, 18b. In each opposed pair 19, the difference of tensions is the same as it is in all of the other opposed pairs 19. Because the opposed pairs 19 are disposed symmetrically about the line 20 parallel to the direction of motion and extending through the center of gravity 5 of the movable element 11, there is a net force to move the movable element 11, but no net moment acting on the movable element 11.

The cable tension arising from pulley friction and from the reaction of the pulleys 17 to angular acceleration is different in different parts of the cable path, increasing in the direction of cable motion at each pulley. As seen in FIG. 2, the cable 16 traverses the pulleys 17 in a sequence whereby both parts of an opposed pair 19 pull the cable over substantially the same number of pulleys 17.

Consider the forces arising from pulley acceleration and friction during motion, as indicated by the arrows in FIG. 2:

Opposed pair:

| Cable | From | To | Rotates Pulleys | No. of Pulleys |
|---|---|---|---|---|
| | Clutch 22 | Pulley 17k | 17k, j, h, g, f | 5 |
| | Pulley 17a | Pulley 17e | 17a, b, c, d | 4 |
| | | | Diference | 1 |
| | Pulley 17j | Pulley 17k | 17j, h, g, f | 4 |
| | Pulley 17a | Pulley 17b | 17b, c, d | 3 |
| | | | Difference | 1 |
| | Pulley 17h | Pulley 17g | 17g, f | 2 |
| | Pulley 17c | Pulley 17d | 17d | 1 |
| | | | Difference | 1 |
| | Pulley 17f | Pulley 17g | 17f | 1 |
| | Pulley 17d | Attachment 18b | None | 0 |
| | | | Difference | 1 |

Because differences in cable tension in the opposed pairs 19 are all the same (in this case, the friction and acceleration force of one pulley), and because the opposed pairs 19 are arranged symmetrically with respect to a line through the center of gravity 5 of the moving element 11, there is no net moment acting to turn the moving element 11.

Cable 16a pulled from one side of the system comes in equal parts from the portions of the cable path that shorten as the moving element travels along the guideway. Thus, the mechanical advantage of the system is equal to the number of opposed pairs 19. In the system of FIG. 2, there are four opposed pairs 19, so the mechanical advantage is 4:1. In practice, mechanical advantage is usually less than 12, although greater mechanical advantages are theoretically possible. The mechanical advantage is the amount of force experienced by the moving element 11 divided by the pulling force applied by the drive pulley 15.

The total moment of inertia felt by the motor 3 can be less using the cable than using a leadscrew. The moment of inertia of the drive pulley 15 and the idler pulleys 17e, 17f closest to the motor along the cable path are felt directly by the motor. However, those idler pulleys 17a, b, c, d, g, h, j, k that lie beyond the parts of the cable path that change length contribute less to the inertia load of the motor because they turn slower than does the drive pulley. The motor experiences only the idler pulley moment of inertia times the square of the ratio of idler pulley to drive pulley speeds. The cable flexibility is sufficient such that no flexible coupling is required for the motor shaft 2 and no flexible struts are required for minor misalignment of the cable path and the guideway 13. In this way, the inertia of the moving parts are minimized.

The cable 16b wraps around a one-way clutch 22 at one of the attachment points 18a and then is attached to a spring 23. The spring maintains the cable 16 at a constant pretension and takes up any excess length if the cable 16 stretches. The clutch 22 prevents the motor 3 from pulling cable from the spring 23 instead of moving the load. A weight or fluid cylinder may substitute for the spring 23.

The steel cables 16 are coated with plastic to retain internal lubricant and to exclude dirt. The coating also insulates them electrically from their mechanical points of attachment 18. Failure of this coating is a reliable precursor to cable failure. Either the coating wears away or broken strands poke out through the coating. In either case, the cable makes metal-to-metal contact with the pulleys. An electric circuit 24 through the cable detects contact with the pulleys 17 and announces imminent failure before any deterioration of performance occurs.

The necessary condition to retain all of the advantages described herein is that the opposed pairs be axi-symmetric with respect to the line through the center of gravity 20 and parallel to the path of motion 13.

For simplicity, FIG. 2 shows the entire cable path in one plane. This is not a requirement. In the preferred embodiment, the cable path does not lie in one plane.

Figure 4:
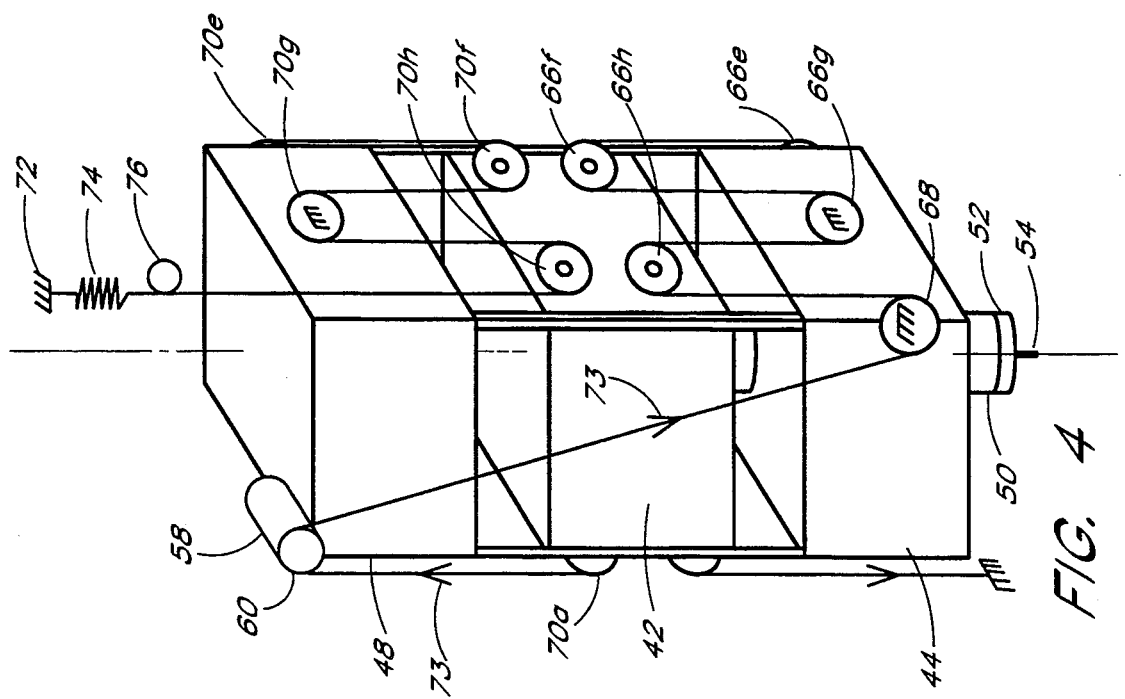
FIG. 4 is a rear perspective view of the alternative cable drive of FIG. 3.
Figure 3:
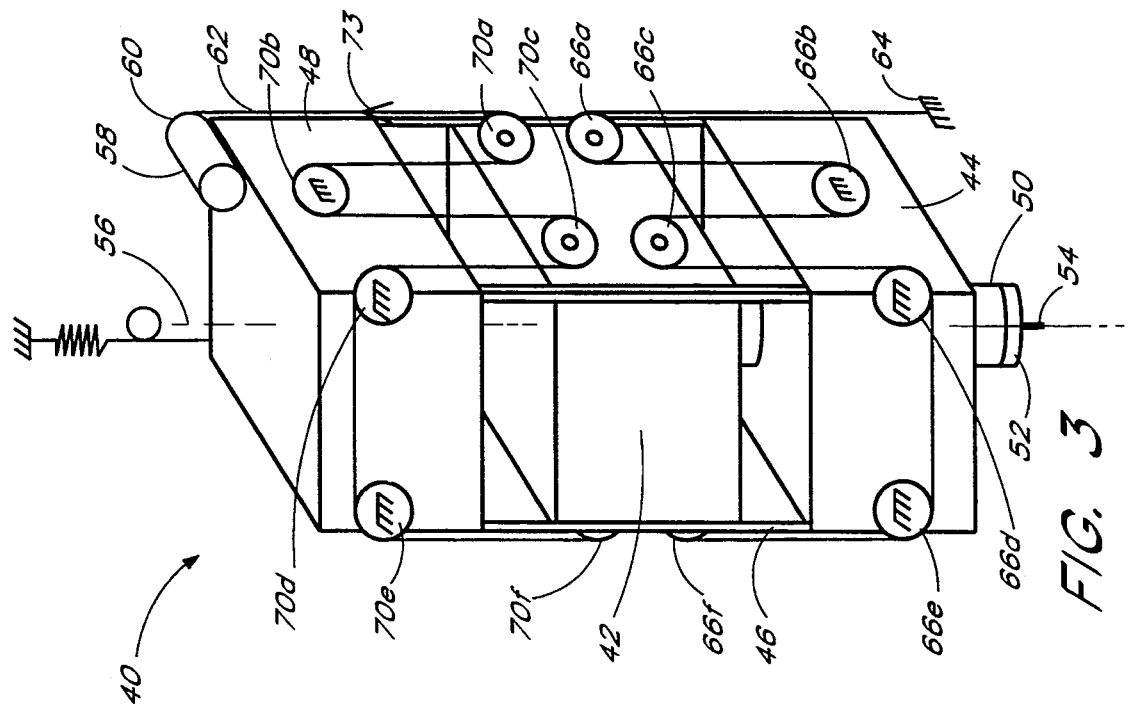
FIG. 3 is a front perspective view schematically depicting an alternative embodiment of a cable drive system of the present invention.

For example, as shown in FIGS. 3 and 4, an alternative cable drive system 40 is shown as adapted to drive a movable work unit or carriage 42. The carriage 42 is rigidly attached to a columnar spindle 50, having a chuck 52 at the lower end adapted to grip a drill bit 54. A guideway for guiding the carriage 42 and drill assembly may be defined by tracks on the inner surfaces of legs 46 extending between an upper support 48 and a lower support 44. Alternatively, the guideway is defined by an aperture in the lower support portion 44. In this respect, the supports 44, 48 are preferably mounted to a frame of a precision drilling machine or other machining device. The cable drive system 40 is thus adapted to reciprocate the carriage 42 vertically along the guideway to cause the drill bit 54 to reciprocate along a precise vertical center line 56.

The cable drive system 40 comprises a prime mover or motor 58 which turns a drive pulley 60 positioned for rotation at a rear upper corner of the upper support 48. A cable 62 threads around the drive pulley 60 and around a plurality of fixed and idler pulleys which together comprise the cable drive system 40. Some of the pulleys are rotatably mounted on the stationary frame supports 44, 48, while other pulleys are rotatably mounted on the moving carriage 42. In the embodiment shown, the cable drive system 40 extends around all four sides of generally rectangular frame supports 44, 48, and around all four faces of the generally rectangular carriage 42. Other frame and carriage configurations are possible, however.

Looking at the front view of FIG. 3, the cable 62 is rigidly fixed at an attachment point 64. In one direction, the cable traverses over a carriage pulley 66a and then around a frame pulley 66b rotatably mounted on the lower support 44 before traveling around a second carriage pulley 66c mounted at the same elevation as the first carriage pulley 66a. The cable 62 then travels around a frame pulley 66d mounted for rotation on the front side of lower support 44 at a perpendicular angle to the carriage pulley 66c. The cable thus is therefore directed around a front corner of the lower support 44 and over another front-mounted frame pulley 66e.

Now looking at FIG. 4, the cable 62 extends from the frame pulley 66e around a carriage pulley 66f mounted on the carriage 42 at a perpendicular angle to the frame pulley. The cable 62 thus is directed around to the left side of the cable drive system 40. From there, the cable 62 loops around a frame pulley 66g, a carriage pulley 66h, and a rear-mounted frame pulley 68 before wrapping around the drive pulley 60.

Referring back to the front view of FIG. 3, the cable 62 leaves the drive pulley 60 in an opposite direction and wraps around a carriage pulley 70a, a frame pulley 70b, and a carriage pulley 70d, before being directed to the front side of the cable drive system 40 by frame pulley 70d. The cable 62 continues around frame pulley 70e, carriage pulley 70f, frame pulley 70g and carriage pulley 70h before being attached to a fixed point 72 via an intermediate spring 74 and a clutch assembly 76.

Rotation of the drive pulley 60 increases the length of cable 62 between the drive pulley and either the fixed point 64 or the fixed point 72. The length of the cable 62 extending in the opposite direction is shortened by a commensurate amount. In the illustrations, arrows 73 depict the drive pulley 60 rotating to shorten the length of the cable between the drive pulley and the fixed point 72, while the length of cable between the drive pulley and the fixed point 64 increases. In this case, the carriage 42 would be driven upward along the guideway. A reverse rotation of the drive pulley 60 causes the carriage 42 to be driven downward.

As described above for the embodiment shown in FIG. 2, each part of the cable path which changes in length is parallel to the direction of motion and is matched by a similar part on the opposite side of the moving element 42, forming an opposed pair. Additionally, there are an even number of opposed pairs of cable lengths arranged axi-symmetrically about the center line 56 parallel to the direction of motion; the centerline 56 passing through the center of gravity of the moving element 42. In this way, the resultant of all the individual cable forces acts on the center of gravity of the moving element 42, while the center of gravity of the moving element need not be in line with any physical part of the cable path. This arrangement leaves space along the line 56, with the center of gravity available for use by feedback measurement device such as a linear scale (not shown).

Furthermore, the mechanical advantage of the system, as was described above for the system of FIG. 2, is equal to the number of opposed pairs. Specifically, looking at FIG. 3, one example of an opposed pair of cable paths comprises one path between fixed point 64 and carriage pulley 56a and another path between carriage pulley 70a and drive pulley 60. Similarly, there exists an opposed pair of cable paths between frame pulley 66b and carriage pulley 66a and between frame pulley 70b and carriage pulley 70a. Going around the cable drive system 40, there are eight opposed pairs and thus, the mechanical advantage of the alternative cable drive is 8:1.

In the illustrated embodiment shown, there are four separate carriage pulleys rotatably mounted on both the right and left faces of the carriage 42. These carriage pulleys may be spaced apart as shown or may be stacked on top of each other as long as they are symmetrically located pairs. More particularly, each pair, such as, for example, 66a and 66c, must be symmetrically disposed about a plane running through the center line 56 and perpendicular to the plane in which the pulleys rotate. To illustrate, an imaginary vertical plane passes through the center line 56 from left to right in a direction perpendicular to the plane in which the pulleys 66a, 66c rotate. The pulley 66a must be located at exactly the same distance as the pulley 66c from this imaginary vertical plane. Of course, the same arrangement holds true for all such pairs of carriage pulleys in the system. Likewise, the frame pulleys arranged on the lower and upper supports 44, 48, respectively, must be spaced symmetrically about central planes. This configuration ensures that there will be no net moment applied to the carriage 42 by the cable drive system 40.

Although this invention is described in terms of certain preferred embodiments, other embodiments that will be apparent to those of ordinary skill in the art are also within the scope of this invention. For example, the component securing the cutting tool could be fixed, while the component defining the guideway could reciprocate. Accordingly, the scope of the invention is intended to be defined by the claims that follow.

I claim:

1. Art apparatus for machining workpieces, comprising:
   a work unit for securing a cutting tool;
   a frame supporting said work unit permitting movement of said work unit along a vertical axis;
   a drive mechanism for vertically reciprocating said work unit relative said frame along said vertical axis, said drive mechanism comprising:
      at least four work unit pulleys attached to said work unit, said work unit pulleys arranged symmetrically about said axis;
      at least four frame pulleys attached to said frame, said frame pulleys arranged symmetrically about said axis, wherein least two of said frame pulleys are attached to said frame above said work unit and at least two of said frame pulleys are attached to said frame below said work unit;
      a flexible cable frictionally engaging each of said pulleys; and
      a motor frictionally connected to said cable capable of selectively moving said cable in a first direction and a second direction, wherein said pulleys are arranged and said cable has a path such that when said cable is moved in said first direction said work unit is raised upward and when said cable is moved in said second direction said work unit is moved downward; and
   a worktable defining a work station positioned beneath said work unit and adapted to secure a workpiece to said table during a machining operation, said worktable being movable in at least one direction in a horizontal plane so as to position a workpiece secured to said table at desired locations beneath said work unit.

2. The apparatus of claim 1, wherein said cable path includes a plurality of portions extending directly between one of said work unit pulleys and one of said at least two frame pulleys above said work unit, and wherein further for each of said plurality of portions extending directly between one of said work unit pulleys and one of said at least two frame pulleys above said work unit, there is a corresponding collinear portion of said cable path extending directly between one of said work unit pulleys and one of said at least two frame pulleys below said work unit.

3. The apparatus of claim 2, wherein each of said plurality of portions extending directly between one of said work unit pulleys and one of said at least two frame pulleys above said work unit and its corresponding collinear portion extending directly between one of said work unit pulleys and one of said at least two frame pulleys below said work unit pull cable over the same number of pulleys.

4. The apparatus of claim 3, wherein said cable has a first end and a second end, said first end and said second end being connected to said frame, further comprising a device which prevents motion of one of said ends of said cable away from said frame, yet allows motion of said one of said ends of said cable toward said frame.

5. The apparatus of claim 4, further comprising means to detect wear of said cable.

6. The apparatus of claim 3, further comprising a feed-back measurement device along said axis.

7. The apparatus of claim 6, wherein said frame defines a guideway within which said work unit reciprocates.

8. Art apparatus for machining workpieces, comprising:
   a work unit for securing a cutting tool;
   a frame supporting said work unit permitting movement of said work unit along a vertical axis;
   a drive mechanism for vertically reciprocating said work unit relative said frame along said vertical axis, said drive mechanism comprising:
      at least eight work unit pulleys attached to said work unit, said work unit pulleys arranged symmetrically about said axis;
      at least eight frame pulleys attached to said frame, said frame pulleys arranged symmetrically about said axis, wherein at least four of said frame pulleys are attached to said frame above said work unit and at least four of said frame pulleys are attached to said frame below said work unit;
      a flexible cable frictionally engaging each of said pulleys; and
      a motor frictionally connected to said cable capable of selectively moving said cable in a first direction and a second direction, wherein said pulleys are arranged and said cable has a path such that when said cable is moved in said first direction said work unit is raised upward and when said cable is moved in said second direction said cable is moved downward; and
   a worktable defining a work station positioned beneath said work unit and adapted to secure a workpiece to said table during a machining operation, said worktable being movable in at least one direction in a horizontal plane so as to position a workpiece secured to said table at desired locations beneath said work unit, wherein said cable path includes a plurality of portions extending directly between one of said work unit pulleys and one of said at least four frame pulleys above said work unit, and wherein further for each of said plurality of portions extending directly between one of said work unit pulleys and one of said at least four frame pulleys above said work unit, there is a corresponding collinear portion of said cable path extending directly between one of said work unit pulleys and one of said at least four frame pulleys below said work unit.

9. The apparatus of claim 8, wherein said work unit has a generally rectangular horizontal cross-section and defines four vertical faces, and wherein further at least four of said work unit pulleys are attached to a first vertical face and at least four of said work unit pulleys are attached to a second vertical face opposite said first vertical face.

10. The apparatus of claim 9, wherein said frame defines a rectangular portion which defines a guideway within which said work unit moves, said rectangular portion defining four vertical sides, and wherein further at least one of said at least four frame pulleys attached to said frame above said work unit is attached to a first side of said rectangular portion and at least one of said frame pulleys are attached to said frame below said work unit is attached to said first side of said rectangular portion and wherein at least one of said at least four frame pulleys attached to said frame above said work unit is attached to a second side of said rectangular portion opposite said first side and at least one of said frame pulleys are attached to said frame below said work unit is attached to said second side of said rectangular portion.

11. The apparatus of claim 11, wherein said frame includes a third side between said first side and said second side to which at least two of said at least four frame pulleys attached to said frame above said work unit are attached and to which at least two of said frame pulleys are attached to said frame below said work unit are attached.

12. The apparatus of claim 11, wherein said cable has a first end and a second end, said first end and said second end being connected to said frame, further comprising a device which prevents motion of one of said ends of said cable away from said frame, yet allows motion of said one of said ends of said cable toward said frame.

13. The apparatus of claim 12, further comprising means to detect wear of said cable.

14. The apparatus of claim 13, further comprising a feed-back measurement device along said axis.

15. The apparatus of claim 8, wherein said cable path includes a plurality of portions extending directly between one of said work unit pulleys and one of said at least four frame pulleys above said work unit, and wherein further for each of said plurality of portions extending directly between one of said work unit pulleys and one of said at least four frame pulleys above said work unit, there is a corresponding collinear portion of said cable path extending directly between one of said work unit pulleys and one of said at least four frame pulleys below said work unit.

16. The apparatus of claim 15, wherein each of said plurality of portions extending directly between one of said work unit pulleys and one of said at least four frame pulleys above said work unit and its corresponding collinear portion extending directly between one of said work unit pulleys and one of said at least four frame pulleys below said work unit pull cable over the same number of pulleys.

17. The apparatus of claim 16, further comprising a device which prevents motion of one of said ends of said cable away from said frame, yet allows motion of said one of said ends of said cable toward said frame.

18. The apparatus of claim 17, further comprising means to detect wear of said cable.

19. The apparatus of claim 18, further comprising a feed-back measurement device along said axis.

20. An apparatus for machining workpieces, comprising:

a first component;

a second component, wherein one of said first component and said second component secures said cutting tool and another of said first component and said second component defines a guideway controlling the relative movement of said first and second units along a vertical axis;

a drive mechanism for causing vertical reciprocation of said first and second components relative one another along said vertical axis, said drive mechanism comprising:

at least four first component pulleys attached to said first component, said first component pulleys arranged symmetrically about said axis;

at least four second component pulleys attached to said second component, said second component pulleys arranged symmetrically about said axis, wherein least two of said second component pulleys are attached to said second component above said first component and at least two of said second component pulleys are attached to said second component below said first component;

a flexible cable frictionally engaging each of said pulleys; and a motor frictionally connected to said cable capable of selectively moving said cable in a first direction and a second direction, wherein said pulleys are arranged and said cable has a path such that when said cable is moved in said first direction said first component is raised upward and when said cable is moved in said second direction said first component is moved downward; and a worktable defining a work station adapted to secure a workpiece to said table during a machining operation, said worktable being movable in at least one direction in a horizontal plane so as to position a workpiece secured to said table at desired locations relative said first component and said second component.

* * * * *

UNITED STATES PATENT AND TRADEMARK OFFICE
CERTIFICATE OF CORRECTION

PATENT NO. : 5,354,159

DATED : October 11, 1994

INVENTOR(S) : William V. Smith

It is certified that error appears in the above-indentified patent and that said Letters Patent is hereby corrected as shown below:

Column 7, line 31, change "Art apparatus" to --An apparatus--.

Column 8, line 29, change "Art apparatus" to --An apparatus--.

Signed and Sealed this

Seventeenth Day of January, 1995

Attest:

BRUCE LEHMAN

*Attesting Officer*      *Commissioner of Patents and Trademarks*